United States Patent [19]

Ishaq et al.

[11] Patent Number: 4,609,429
[45] Date of Patent: Sep. 2, 1986

[54] PROCESS FOR MAKING A SMALL DYNAMIC MEMORY CELL STRUCTURE

[75] Inventors: Mousa H. Ishaq, Essex Junction; Wendell P. Noble, Jr., Milton, both of Vt.

[73] Assignee: International Business Machines Corporation, Armonk, N.Y.

[21] Appl. No.: 627,250

[22] Filed: Jul. 2, 1984

[51] Int. Cl.[4] .................. H01L 21/265; H01L 21/302
[52] U.S. Cl. ..................................... 156/656; 156/657; 156/659.1; 29/571; 29/576 B; 29/578; 148/1.5
[58] Field of Search ............ 156/643, 656, 655, 659.1, 156/662, 657; 204/192 E; 148/186, 187, 188, 1.5; 29/571, 576 B, 578; 357/23.6, 41; 365/182

[56] References Cited

U.S. PATENT DOCUMENTS

| 3,387,286 | 6/1968 | Dennard | 340/173 |
| 3,811,076 | 5/1974 | Smith, Jr. | 317/235 R |
| 3,841,926 | 10/1974 | Garnache et al. | 148/188 |
| 4,343,082 | 8/1982 | Lepselter et al. | 29/571 X |
| 4,365,405 | 12/1982 | Dickman et al. | 29/576 B X |
| 4,398,341 | 8/1983 | Geipel, Jr. et al. | 29/578 |

FOREIGN PATENT DOCUMENTS

| 55-154759(A) | 5/1979 | Japan . | |
| 56-91829 | 12/1982 | Japan | 156/643 |

OTHER PUBLICATIONS

IBM Technical Disclosure Bulletin, vol. 21, No. 9, Feb., 1979, pp. 3823–3825, "Double Polysilicon Dynamic Random-Access Memory Cell with Increased Charge Storage Capacitance", by V. L. Rideout.

Johnson, Jr. et al., "Etch Stop for R.I.E. of Polysilicon", IBM Tech. Discl. Bull., vol. 21, No. 2, Jul. 1978, pp. 599–600.

Howard et al., "Process for SBD Metallurgies", IBM Tech. Discl. Bull., vol. 22, No. 5, Oct. 1979, pp. 1823–1824.

Primary Examiner—Edward Kimlin
Assistant Examiner—Ramon R. Hoch
Attorney, Agent, or Firm—Stephen J. Limanek

[57] ABSTRACT

A process is provided for making a conductive structure for a semiconductor circuit, such as a one device dynamic random access memory cell, which includes the steps of depositing a conductive layer on a surface of a semiconductor substrate having a given type conductivity spaced from a storage node, depositing a layer of polysilicon over the conductive layer, depositing a layer of photoresist over the polysilicon layer, defining an opening in the photoresist layer and implanting ions of a conductivity type opposite to that of the given type conductivity through the opening and the polysilicon layer into the semiconductor substrate to form therein a conductive pocket or region having the opposite type conductivity resulting in, e.g., a highly conductive bit/-sense line of a memory cell.

14 Claims, 10 Drawing Figures

PROCESS FOR MAKING A SMALL DYNAMIC MEMORY CELL STRUCTURE

TECHNICAL FIELD

This invention relates to an integrated semiconductor circuit process, and more particularly to a process for making a dynamic one device memory cell which uses a single field effect transistor and a storage capacitor for storing binary digits of information.

BACKGROUND ART

Integrated semiconductor memory circuits, particularly those employing cells which include essentially a storage capacitor and a switch have achieved relatively high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line. In also commonly assigned U.S. Pat. No. 3,811,076 by W. M. Smith and U.S. Pat. No. 3,841,926 by R. H. Garnache and W. M. Smith, both filed January 2, 1973, there is disclosed a one device field effect transistor memory cell of the type described in the above identified Dennard patent which utilizes a layer of doped polysilicon and an N+ diffusion region in a P type semiconductor substrate separated by a dielectric medium disposed on the surface of the semiconductor substrate for forming the storage capacitor of the cell. The polysilicon layer extends beyond the storage capacitor to act as a field shield between adjacent cells by applying a negative bias or fixed negative potential to the polysilicon layer. The N+ diffusion region of the storage capacitor is formed by using a doped segment of an insulating layer disposed on the surface of the semiconductor substrate and out diffusing the dopant into the substrate. When the doped insulating segment is formed for the storage capacitor, another such segment is formed to provide a second N+ diffusion region which acts as the bit/sense line of the cell. As can be understood, with the bit/sense line using an N+ diffusion region or strip in the presence of a conductive polysilicon layer or field shield, care must be exercised to minimize the bit/sense line capacitance particularly since a single bit/sense line is often connected to one hundred or more cells. In an effort to minimize the bit/sense line capacitance, it is known to retain the doped insulating segment in position even after the dopant thereof has been diffused into the semiconductor substrate to form the N+ diffused bit/sense lines. By retaining this insulating segment over the N+ diffused bit/sense line, the field shield is more remotely spaced from at least portions of the bit/sense line providing a decrease in the bit/sense line capacitance and thus improving the transfer ratio between the bit/sense line and the associated storage capacitors. Although retaining the doped insulating segment over the bit/sense line decreases the bit/sense line capacitance, in view of the small size of the storage capacitances desired in current memories, further reduction in the bit/sense line capacitance is necessary in order to maintain a satisfactory transfer ratio between the small storage capacitance of the cell and the bit/sense line capacitance into which the signal or data is fed from the storage capacitance.

In IBM Technical Disclosure Bulletin, Vol. 21 No. 9, February 1979, pp. 3823–3825, there is disclosed a one device memory cell which advantageously uses two layers of polysilicon.

Commonly assigned U.S. Pat. No. 4,398,341, filed Sept. 21, 1981, by H. J. Geipel and L. A. Nesbit, teaches the use of a metal-silicon structure to provide improved conduction for integrated semiconductor circuits.

Japanese Pat. No. 55-154759(A), filed May 23, 1979, discloses a method for forming a storage node in a memory cell, spaced from a bit/sense line, by implanting impurity ions through a layer of polysilicon.

DISCLOSURE OF THE INVENTION

It is an object of this invention to provide a method for making an improved conductive structure for a semiconductor circuit and more particularly for a very compact one device memory cell having a highly conductive bit/sense line which is self-aligned with respect to the storage node.

In accordance with the teachings of this invention a method is provided for making a conductive structure for a semiconductor circuit which includes the steps of depositing a conductive layer on a surface of a semiconductor substrate having a given type conductivity, depositing a layer of polysilicon over the conductive layer, depositing a layer of photoresist over the polysilicon layer, defining an opening in the photoresist layer and implanting ions of a conductivity type opposite to that of the given type conductivity through the opening and the polysilicon layer into the semiconductor substrate to form therein a highly conductive pocket or region having the opposite type conductivity.

In a more specific aspect, the present invention provides a method for making a memory structure which includes the steps of growing a first thin oxide layer on a semiconductor substrate having a given type conductivity, defining a first region at the surface of the semiconductor substrate, forming at the surface of the semiconductor substrate without the first region a second region having a higher given conductivity than that of the substrate, removing a portion of the oxide layer to form a first opening therein to the semiconductor substrate which extends from the first region to the second region, depositing within the opening a first layer of conductive material, depositing a second conductive layer of etch-stop material over the first layer, which has given etching characteristics, depositing a first layer of polysilicon over the oxide and etch-stop layers, the given etching characteristics of the etch-stop material being different from those of the polysilicon, depositing a layer of photoresist over the polysilicon layer, defining second and third spaced apart openings within the photoresist layer, the second opening being aligned within the edges of the first opening, and the third opening extending from the first region to the second region, implanting ions of the opposite type conductivity through the second and third openings and the polysilicon layer into the semiconductor substrate to form first and second highly conductive pockets or regions of the opposite type conductivity, forming a fourth opening defined by the second and third openings through the polysilicon, the oxide, the etch-stop material and the conductive layers to the surface of the semiconductor substrate, growing a second thin oxide layer on the semiconductor substrate within the fourth opening and on exposed surface of the polysilicon layer, and depositing a second layer of polysilicon over the second thin oxide layer.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
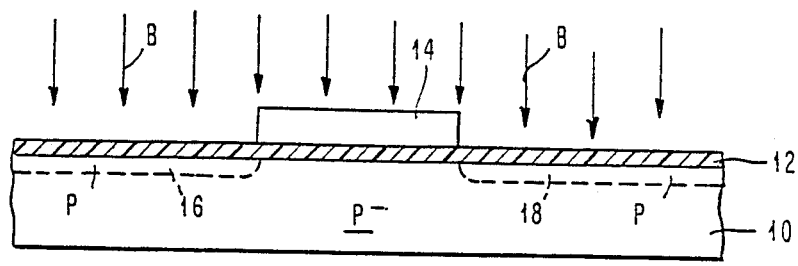
FIGS. 1–8 are sectional views of a memory cell made after successive steps during the fabrication thereof in accordance with one embodiment of the process of this invention.

Referring to the drawings in more detail, there is illustrated in FIG. 1 a sectional view of a memory cell structure made during an early stage of the process of the present invention. The structure includes a semiconductor substrate 10, preferably made of silicon and having a P- type conductivity. A first layer of silicon dioxide 12 is grown on the surface of the substrate 10, followed by the deposition of a first layer of photoresist 14 which is formed or defined to provide a region where a switching device or field effect transistor is to be located. Boron ions B are then introduced through the silicon dioxide layer outside of the edges of the photoresist 14 forming P regions 16 and 18 for parasitic threshold control.

Figure 2:
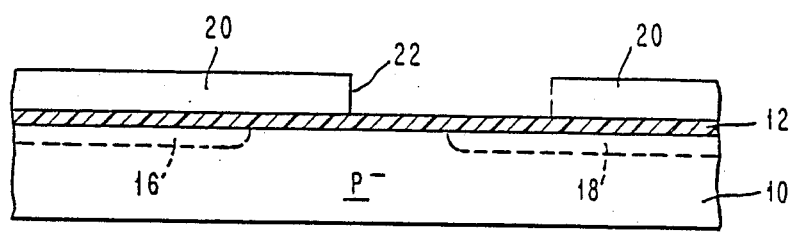
Figure 3:
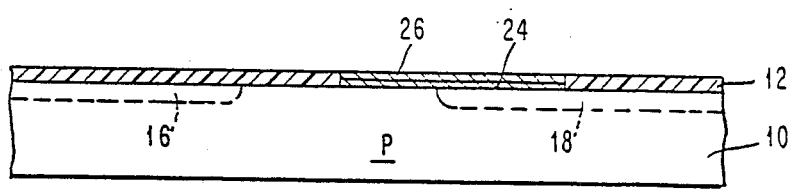

The first layer of photoresist 14 is now completely removed and a second layer of photoresist 20 is deposited on the first layer of silicon dioxide. An opening 22 is formed in the second layer of photoresist 20 over an end segment of the P region 18 which defines a bit/sense line region of the memory cell structure, as illustrated in FIG. 2 of the drawings. By using a known dip etch technique, the silicon dioxide in layer 12 within the opening 22 is removed so as to expose the surface of the substrate 10. Using known evaporation techniques, a conductive layer 24, preferably tungsten, approximately 200Å thick, is deposited over the second photoresist layer 20 and onto the exposed surface of substrate 10 through opening 22, followed by a layer of etch-stop material 26, preferably cobalt, approximately 100Å thick. The photoresist layer 20 is then lifted off by known techniques to dispose of all the tungsten and cobalt except for that located within opening 22 on the surface of the substrate 10, as indicated in FIG. 3.

Figure 4:
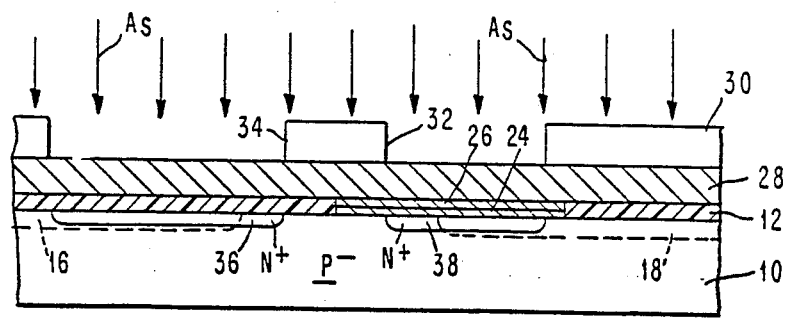
Figure 5:
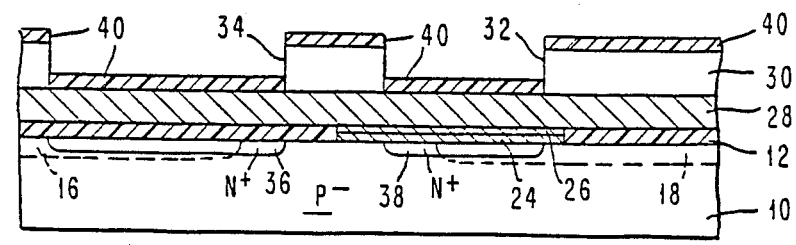

A first layer of polysilicon 28 is then deposited over the cobalt 26 and the silicon dioxide layer 12, with a third layer of photoresist 30 having openings 32 and 34 deposited over the first polysilicon layer 28. The opening 32 is arranged so as to be disposed within the edges of the tungsten and cobalt layers 24 and 26, respectively, as indicated in FIG. 4, and the opening 34 is arranged so as to extend from a point between the P regions 16 and 18 to a point within P region 16. The opening 32 defines the width of the bit/sense line of the memory cell structure and the opening 34 defines the cell structure's storage node. Using the third photoresist layer 30 as a mask, N-type ions, preferably arsenic As, are implanted into the surface of the substrate 10 through the polysilicon layer 28, silicon dioxide layer 12 and the tungsten and cobalt layers 24 and 26, respectively, to provide an N+ diffusion region 36 for the storage node of the cell structure and an N+ diffusion region 38 for the bit/sense line, as shown in FIG. 4. It can be seen that the N+ diffusion regions 36 and 38 extend beyond the edges of the P regions 16 and 18, respectively. A layer of evaporated material 40, which may be either an insulator or a conductor but preferably magnesium oxide MgO, is deposited onto the third layer of photoresist 30 and through openings 32 and 34 onto the surface of the first polysilicon layer 28, as indicated in FIG. 5 of the drawings.

Figure 6:
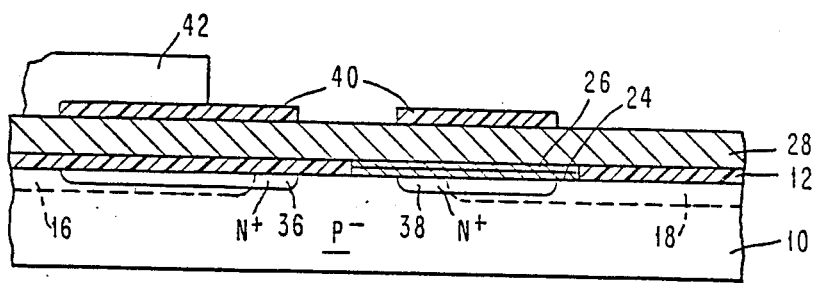

To lift off the magnesium oxide layer 40, except within openings 32 and 34, the third photoresist layer 30 is stripped or removed by known techniques. A fourth layer of photoresist 42 is applied to the structure and defined so as to provide interconnections between storage node plates of a memory array, as indicated in FIG. 6, in lines parallel to the bit/sense lines.

Figure 7:
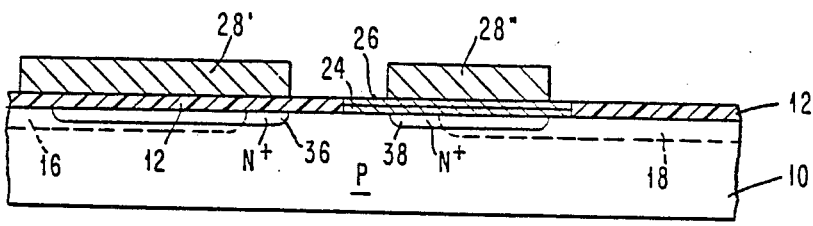

The first layer of polysilicon 28 is etched so as to be removed in all locations except where the polysilicon is covered or protected by either the magnesium oxide layer 40 or the fourth photoresist layer 42 to form segments 28' and 28", as shown in FIG. 7, with segment 28' of the polysilicon layer 28 acting as a plate for the storage node 36 and segment 28" acting as a portion of the bit/sense line of the cell structure. It should be noted that segments 28' and 28" are aligned with the N+ diffusion regions 36 and 38, respectively, and are interconnected over the boron doped substrate 10.

It should also be noted that the layer 40 can be any evaporated material, insulator or conductor, which is attacked by an etchant at a much slower rate than the rate at which that etchant attacks the underlying layer of polysilicon 28. Furthermore, the cobalt layer 26 acts as an etch stop in the absence of the silicon dioxide layer 12, with the tungsten being used to eliminate a reaction between the cobalt and the silicon substrate 10. It can be seen that the tungsten-cobalt layers 24 and 26 along with polysilicon segment 28" form a highly conductive buried bit/sense line in contact with the N+ diffusion region 38. With process temperatures up to approximately 1000° C., cobalt is effective as an etch stop but tungsten and other refractory metals, such as tantalum Ta and molybdenum Mo, are needed to prevent the cobalt-silicon reaction.

After stripping off the fourth layer of photoresist 42 and etching off the remaining layer of magnesium oxide with, e.g., oxalic acid, the structure is dip etched to remove the tungsten and cobalt adjacent to the polysilicon segment 28" and is again dip etched to remove the silicon dioxide exposed without the polysilicon segments 28' and 28". A second layer of silicon dioxide 44 is now grown on the exposed surfaces of the substrate 10 as well as over the exposed surfaces of the polysilicon segments 28' and 28". It should be noted that the layer of silicon dioxide 44 is grown thicker over the surfaces of the polysilicon segments 28' and 28" than over the surface of the single crystal substrate 10. To exploit this differential growth to the fullest, oxidation is carried out at a temperature of about 800° C.

Figure 8:
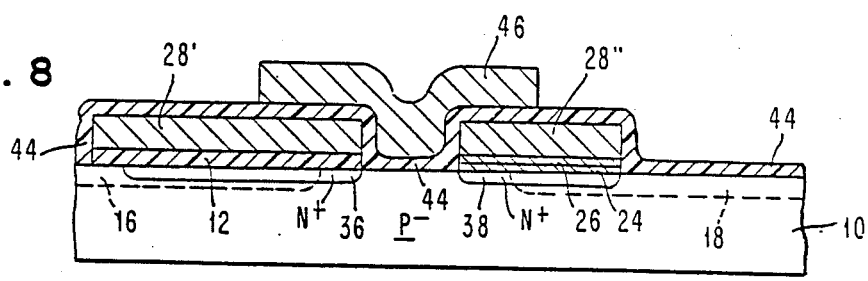

The cell structure is completed, as shown in FIG. 8, by depositing a second layer of polysilicon 46 and defining it so as to form a gate electrode for the switching device or field effect transistor of the one device dynamic memory cell. If desired, an additional booster implant of boron may be made to provide an additional stop in the ungated regions of the array of cells and in regions of the silicon substrate 10 that do not have thick insulating layers. Although not mentioned hereinabove, it should be understood that support circuits may also be provided on the substrate 10 which require thick or recessed insulating layers, as do regions between the memory cells. These thick layers may be formed prior to growing the thin silicon dioxide layer 12 shown in FIG. 1 of the drawing.

Figure 9:
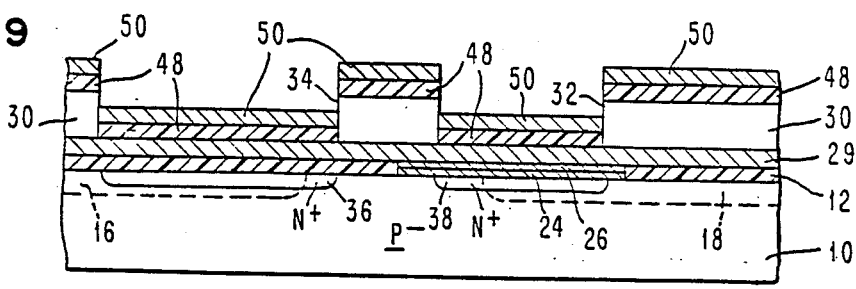
FIGS. 9 and 10 are sectional views of a memory cell made after successive steps during the fabrication thereof in accordance with another embodiment of the process of this invention.
Figure 10:
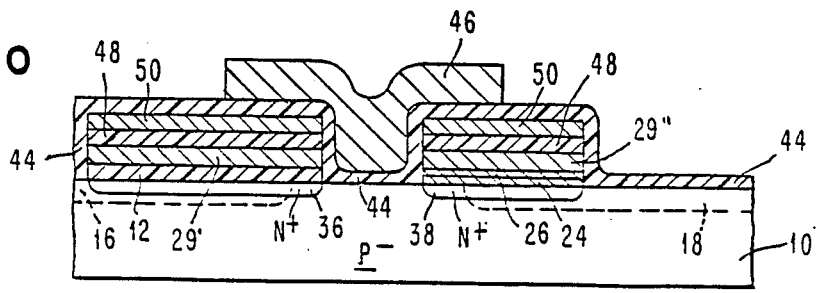

In FIGS. 9 and 10 of the drawings, there is indicated another embodiment of the process of the present invention. The steps of the process of this embodiment of the invention are similar to those described in connection with FIGS. 1 through 4 of the drawings, with the exception of a polysilicon layer 29 of FIG. 9 being formed thinner than the polysilicon layer 28 of FIG. 4. Furthermore, instead of depositing a layer of magnesium oxide 40 as indicated in FIG. 5, a layer of tungsten silicide $WSi_2$ 48, as shown in FIG. 9, is evaporated over the structure, followed by a layer of cobalt Co 50. After removing the unwanted portions of tungsten silicide 48 and cobalt 50 by conventional lift off techniques and etching exposed polysilicon layer 29, silicon dioxide layer 12, tungsten layer 24 and cobalt layer 26, which defines the polysilicon segments 29' and 29'', the layer of silicon dioxide 44 is deposited over the exposed surface of the substrate 10 and the exposed surfaces of the layers 12, 24, 26, 29', 29'', 48 and 50 located over the N+ diffusion regions 36 and 38. The second layer of polysilicon 46 is then used to provide the gate electrode of the field effect transistor of the memory cell structure. It can be seen that this embodiment of the process of the present invention provides a storage node plate and a bit/sense line which are even more conductive than the plate and line of the embodiment illustrated in FIGS. 1-8.

It should be understood that by using the method of the present invention illustrated in FIGS. 9 and 10, the layer of polysilicon 29 may be made significantly thinner than the polysilicon layer 28 illustrated in, e.g., FIG. 4, without any sacrifice in conductivity. For example, the layer of polysilicon 29 may be approximately 1000Å thick over a 150Å thick insulation layer 12 with the arsenic implantation being performed at about 180 Kev, whereas the layer of polysilicon 28 is generally 2000Å thick with the arsenic implantation being performed at about 340 Kev. Thus, in the embodiment of FIGS. 9 and 10, a higher concentration of arsenic ions may be provided in N+ diffusion regions 36 and 38 at a lower energy implant level while still providing the cell structure with highly conductive storage node and storage capacitor plates and highly conductive bit/sense lines. If desired, the cobalt layer 50 in FIGS. 9 and 10 may be replaced with a layer of magnesium oxide.

It can be seen that a process has been provided in accordance with the present invention which significantly increases dynamic random access memory array densities by introducing a self-aligned storage node to the capacitor plate and eliminating thick oxide isolation between storage nodes by the use of heavily implanted P regions such as region 16. Furthermore, it should be noted that this invention provides an improved process for forming a self aligned storage capacitor with a low resistivity node and field plate and a highly conductive bit/sense line. In the process of this invention high density and high performance are achieved without any significantly added process complexity. This process is usable for forming N+ diffusion regions in P- type silicon or P+ diffusion regions in N- type silicon by merely interchanging the conductivities, as is well known.

While the invention has been particularly shown and described with reference to preferred embodiments thereof, it will be understood by those skilled in the art that various changes in form and details may be made therein without departing from the spirit and scope of the invention.

What is claimed is:

1. A process for making a conductive structure which includes the steps of:

depositing a patterned conductive layer having edges on a surface of a semiconductor substrate and in contact therewith, said substrate having a given type conductivity, depositing a layer of polysilicon over said conductive layer and in contact therewith, said conductive layer having a significantly different etch rate than that of said layer of polysilicon, depositing a layer of photoresist over said polysilicon layer, defining an opening in said photoresist layer within the edges of said conductive layer, implanting ions of a conductivity type opposite to that of said given type conductivity through said opening and said polysilicon and conductive layers into said semiconductor substrate to form therein a highly conductive pocket having said opposite type conductivity, and etching said layer of polysilicon without said opening to said conductive layer.

2. A process as set forth in claim 1 further including the steps of depositing on said layer of photoresist and on said layer of polysilicon within said opening a first layer of material having an etch rate significantly different from that of said layer of polysilicon, removing said layer of photoresist, and etching the exposed surfaces of said layer of polysilicon and said conductive layer without the remaining segment of said first layer.

3. A process for making a conductive structure which includes the steps of:

depositing a first conductive layer on a surface of a semiconductor substrate and in contact therewith, said substrate having a given type conductivity, depositing a second patterned conductive layer having edges and having a given etch rate on said first conductive layer and in contact therewith, depositing a layer of polysilicon over said second layer and in contact therewith, the etch rate of said second layer being signficantly different from the etch rate of said polysilicon layer, depositing a layer of photoresist over said polysilicon layer, defining an opening in said photoresist layer within the edges of said second conductive layer, implanting ions of a conductivity type opposite to that of said given conductivity type through said opening and said polysilicon and first and second conductive layers into said semiconductor substrate to form therein a highly conductive pocket having said opposite type conductivity, and etching said layer of polysilicon without said opening to said second conductive layer.

4. A process for making a conductive structure which includes the steps of:

depositing a layer of tungsten on a surface of a semiconductor substrate and in contact therewith, said substrate having a given type conductivity and being made of silicon, depositing a patterned layer of cobalt having edges on said tungsten layer and in contact therewith, depositing a layer of polysilicon over said cobalt layer and in contact therewith, depositing a layer of photoresist over said polysilicon layer, defining an opening in said photoresist layer within the edges of said layer of cobalt, implanting ions of a conductivity type opposite to that of said given conductivity type through said opening and said polysilicon, cobalt and tungsten layers into said semiconductor substrate to form therein a highly conductive pocket having said opposite type conductivity, and etching said layer of polysilicon without said opening to said layer of cobalt.

5. A process for making a memory structure which includes the steps of growing a first thin oxide layer on a semiconductor substrate, said substrate having a given type conductivity of a given conductivity magnitude, defining a first region at the surface of said semiconductor substrate, forming at the surface of said semiconductor substrate without said first region a second region having said given conductivity type of higher magnitude than that of said given magnitude, removing a portion of said oxide layer to form a first opening therein to said semiconductor substrate extending from said first region to said second region, depositing within said opening a layer of tungsten in contact with said semiconductor substrate, depositing a layer of cobalt on said tungsten layer and in contact therewith, depositing a first layer of polysilicon over said oxide and cobalt layers and in contact with said cobalt layer, depositing a layer of photoresist over said polysilicon layer, defining second and third spaced apart openings within said photoresist layer, said second opening being aligned within the edges of said first opening and said third opening extending from said first region to said second region, implanting ions of opposite type conductivity to that of said given type conductivity through said second and third openings and said polysilicon layer into said semiconductor substrate to form first and second highly conductive pockets of said opposite type conductivity, forming a fourth opening defined by said second and third openings through said polysilicon, oxide, cobalt and tungsten layers to the surface of said semiconductor substrate, growing a second thin oxide layer on said semiconductor substrate within said fourth opening and an oxide layer thicker than said second thin oxide layer on exposed surfaces of said polysilicon layer, and depositing a second layer of polysilicon over said second thin oxide layer.

6. A process for making a memory cell which includes the steps of forming a first insulating layer having a first opening therein on a surface of a semiconductor substrate, said substrate having a given type conductivity, forming a first conductive layer having a given etch rate over said substrate within said opening and in contact with said semiconductor substrate, depositing a first layer of polysilicon over said insulating layer and said conductive layer and in contact with said conductive layer, the etch rate of said conductive layer being significantly different from the etch rate of said first layer of polysilicon, depositing a layer of photoresist having second and third spaced apart openings over said layer of polysilicon, said second opening being disposed within the edges of said first opening, implanting ions of opposite type conductivity to that of said given type conductivity through said second and third openings to form first and second diffusion regions of said opposite type conductivity within said substrate, removing said layer of photoresist, forming a fourth opening defined by said second and third openings through said polysilicon, insulating and conductive layers to the surface of said substrate, forming a second insulating layer on the surface of said substrate within said fourth opening, and depositing a second layer of polysilicon over said second insulating layer.

7. A process as set forth in claim 6 further including the steps of depositing a second conductive layer over said first layer of polysilicon and forming said fourth opening through said second conductive layer.

8. A process as set forth in claim 6 wherein said substrate has a given type conductivity of a given conductivity magnitude and further including the step of forming a region of said given type conductivity having a conductivity magnitude greater than that of said given conductivity magnitude at the edges of said first and second diffusion regions remote from said fourth opening.

9. A process as set forth in claim 6 wherein said first conductive layer is made of a refractory metal.

10. A process as set forth in claim 9 wherein said refractory metal has an etch rate significantly slower than that of said layer of polysilicon.

11. A process as set forth in claim 10 wherein said refractory metal is cobalt.

12. A process as set forth in claim 6 wherein said first conductive layer includes a first film made of cobalt and a second film made of tungsten disposed between said cobalt film and the surface of said substrate.

13. A process as set forth in claim 7 wherein said second conductive layer is a silicide layer and further including the steps of depositing on said silicide layer a protective layer having an etch rate significantly slower than that of said first layer of polysilicon and forming said fourth opening through said protective layer.

14. A process as set forth in claim 13 wherein said protective layer is made of cobalt.

* * * * *